United States Patent [19]

Keryhuel et al.

[11] Patent Number: 4,641,176
[45] Date of Patent: Feb. 3, 1987

[54] SEMICONDUCTOR PACKAGE WITH CONTACT SPRINGS

[75] Inventors: Alain Keryhuel, Pavilly; Christian Meigne, Barentin, both of France

[73] Assignee: Burroughs Corporation, Detroit, Mich.

[21] Appl. No.: 885,339

[22] Filed: Jul. 11, 1986

Related U.S. Application Data

[63] Continuation of Ser. No. 763,779, Aug. 9, 1985, abandoned, which is a continuation of Ser. No. 705,056, Feb. 26, 1985, abandoned, which is a continuation of Ser. No. 600,291, Apr. 14, 1984, abandoned, which is a continuation of Ser. No. 318,781, Nov. 6, 1981, abandoned.

[30] Foreign Application Priority Data

Jan. 26, 1981 [FR] France ................... 81 01406

[51] Int. Cl.[4] .................. H01L 23/02; H01L 23/50; H05K 7/12; H01R 13/02
[52] U.S. Cl. .......................... 357/74; 357/79; 357/80; 174/52 S; 339/17 CF; 361/408
[58] Field of Search .............. 357/68, 74, 79, 80; 174/52 S; 361/400, 408; 339/17 CF

[56] References Cited

U.S. PATENT DOCUMENTS

| | | | |
|---|---|---|---|
| 3,558,993 | 1/1971 | Rigby | 357/80 |
| 3,842,189 | 10/1974 | Southgate | 174/525 |
| 3,904,262 | 9/1975 | Cutchaw | 339/17 CF |
| 4,042,861 | 8/1977 | Yasuda et al. | 361/400 |
| 4,079,511 | 3/1978 | Grabbe | 357/74 |
| 4,147,889 | 4/1979 | Andrews et al. | 357/79 |
| 4,166,665 | 9/1979 | Cutchaw | 339/17 CF |
| 4,195,193 | 3/1980 | Grabbe et al. | 357/74 |
| 4,210,462 | 7/1980 | Tourneux | 357/74 |
| 4,223,243 | 9/1980 | Oliver et al. | 357/68 |
| 4,264,917 | 4/1981 | Ugon | 357/74 |
| 4,327,953 | 5/1982 | Slagel et al. | 339/17 CF |
| 4,345,108 | 8/1982 | Oathe et al. | 357/74 |
| 4,369,330 | 1/1983 | Pilz | 357/74 |

FOREIGN PATENT DOCUMENTS

| | | | |
|---|---|---|---|
| 0021643 | 1/1981 | European Pat. Off. | 357/74 |
| 2033678 | 12/1970 | France | 357/74 |
| 2149350 | 3/1973 | France | 357/70 |
| 608314 | 12/1978 | Switzerland | 357/70 |
| 1185857 | 3/1970 | United Kingdom | 357/70 |
| 2025129 | 1/1980 | United Kingdom | 357/70 |

*Primary Examiner*—William D. Larkins
*Assistant Examiner*—John Lamont
*Attorney, Agent, or Firm*—Mervyn L. Young; Kevin R. Peterson

[57] ABSTRACT

An integrated circuit package for high density applications comprises spring contacts on one face thereof for its removable mounting onto a printed circuit board, the mounting being accomplished by means of a frame assembly and the package being automatically fabricable in a continuous flow process involving its assembly on a transport tape and its final cutting therefrom.

17 Claims, 14 Drawing Figures

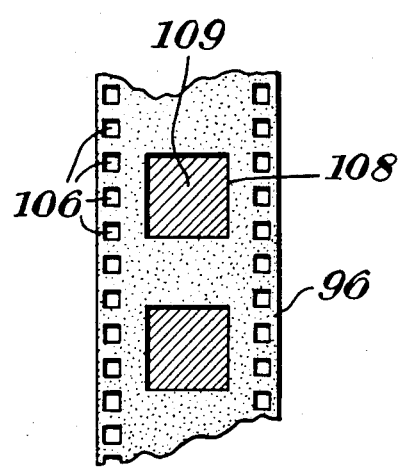
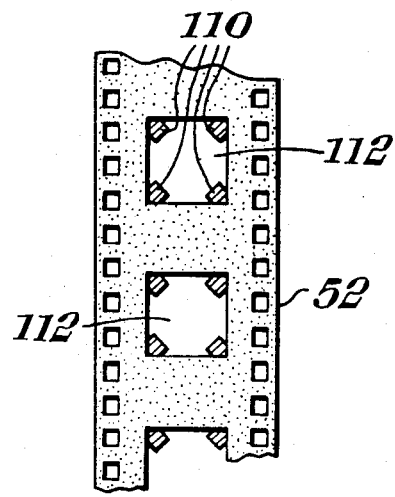
Fig. 5    Fig. 6
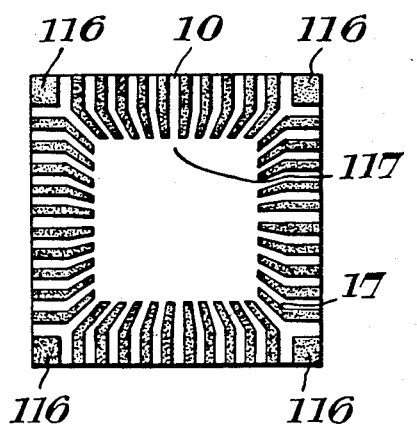
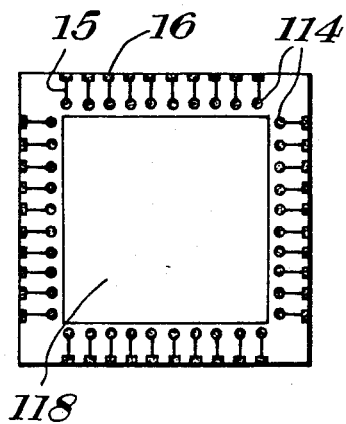
Fig. 7    Fig. 8

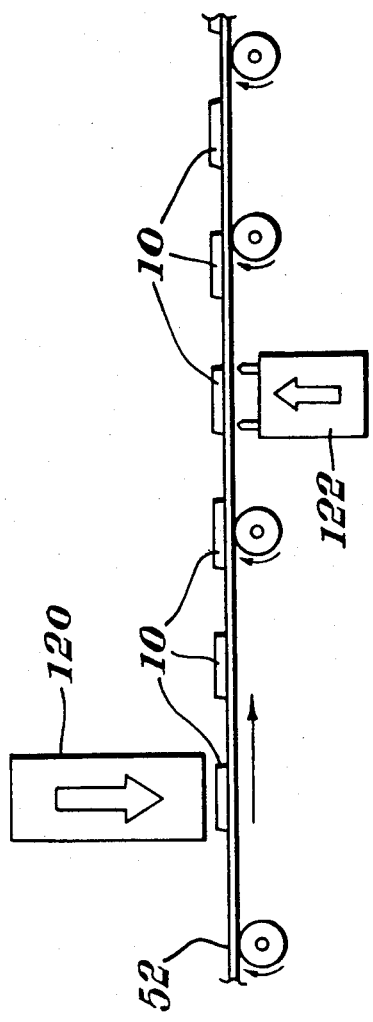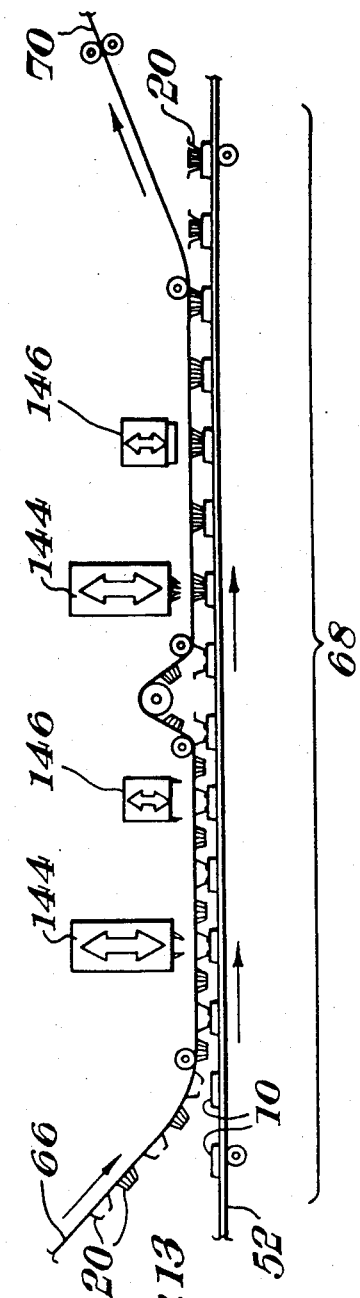

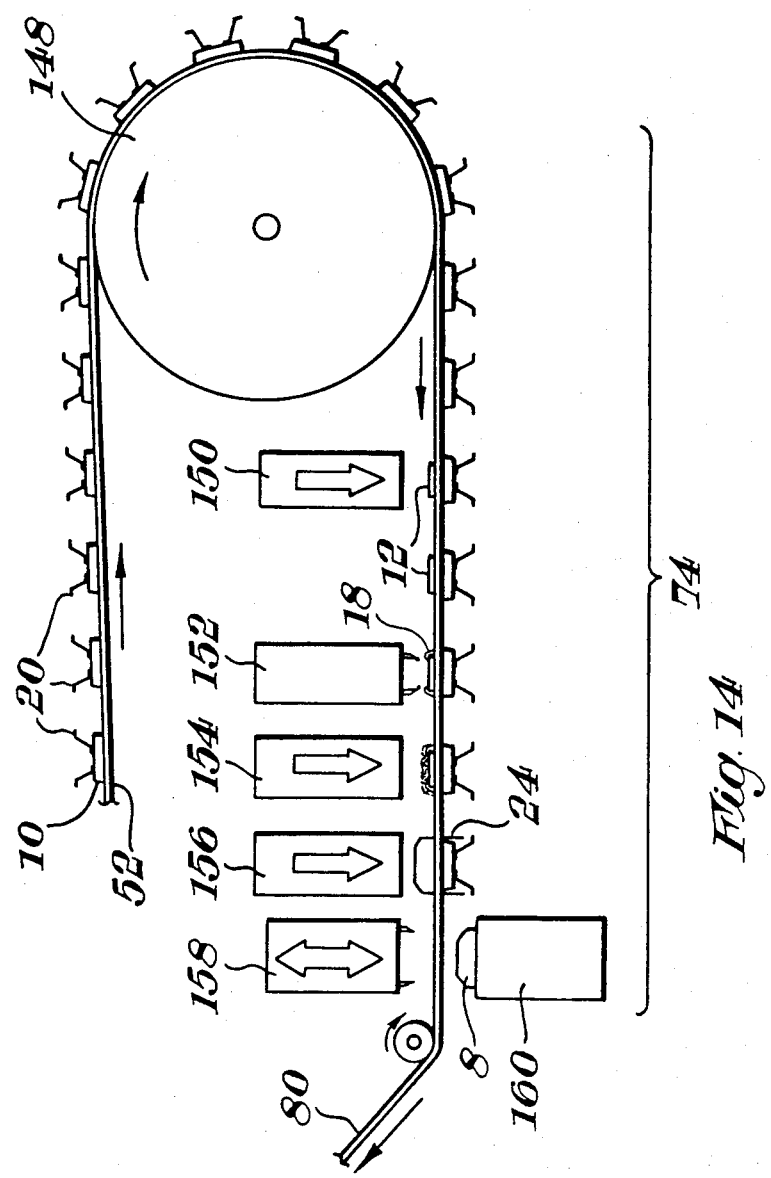

SEMICONDUCTOR PACKAGE WITH CONTACT SPRINGS

This application is a continuation of Ser. No. 763,779 filed Aug. 9, 1985, now abandoned, which was a continuation of Ser. No. 705,056, filed Feb. 26, 1985, now abandoned, which was a continuation of 600,291, filed Apr. 14, 1984, now abandoned, which was a continuation of Ser. No. 318,781, filed Nov. 6, 1981, now abandoned.

BACKGROUND OF THE INVENTION

1. Field of the Invention

The present invention relates to a package for an integrated circuit, means for its mounting onto a printed circuit board and a method for its fabrication.

2. The Prior Art

The areal component density advantage gained by the use of integrated circuits is lost to some extent by the areal inefficiency of current packaging techniques, where the integrated circuit, itself occupies only a small fraction of the package area, the rest being used for metal parts for connecting the circuit to the outside world. Dense packages, such as the flatpack, overcome this disadvantage at the cost of requiring to be soldered onto circuit boards making replacement difficult and laborious. It is therefore desirable to provide an integrated circuit package of high areal efficiency which does not require to be soldered to a board. It is also desirable to provide area-effective means of mounting such a package and a method for its automatic fabrication.

SUMMARY OF THE INVENTION

According to a first aspect of the present invention, there is provided a package for an integrated circuit comprising a planar carrier for the affixing thereon and electrical connection thereto, on a first surface thereof of an integrated circuit, connection means for transferring said electrical connection from said first surface to the second surface of said carrier, spring contact means affixed to and projecting from said second surface, electrically coupled to said connection means and pressible onto an external circuit board for providing electrical connection between the board and said integrated circuit, and lid means for enclosing said integrated circuit and said first surface of said carrier.

Such a package may be used to house other than integrated circuits and requires means for clamping it to a board.

Therefore, according to a second aspect of the present invention, there is provided means for mounting a spring contact package or packages onto a printed circuit board comprising a frame attachable to said board and provided with one or more through penetrating apertures for the insertion therethrough and location of a package or packages with its or their spring contacts engaging contact pads on said board, and means for compressing said package or packages into said aperture or apertures.

Such a package should also be capable of automatic production.

Therefore, according to a third aspect of the present invention, there is provided a method of manufacture for spring contact packages comprising the fabrication of a transport tape, the attachment to said transport tape of carriers, the carriers being accessible from both sides, the fabrication of a spring contact tape whereon there are provided a plurality of spring contact sets with the same spacing as said carriers, the uniting with and the attachment of said spring contact sets to a first side of said carriers, the cutting from said spring contact tape of said spring contact sets, the attachment on a second side of said carriers of the component or components to be housed, the electrical bonding of said component or components to said carrier, the attachment of a lid thereover and the removal of the whole from said transport tape.

BRIEF DESCRIPTION OF THE PREFERRED EMBODIMENT

In a preferred embodiment an integrated circuit is glued to a first side of a glass-epoxy or other material, board and gold wire bonded to a plurality of pads which are connected to the second side of the carrier through plated holes. Spring contacts are soldered to conductors coming from the through plated holes and project from the second side of the board. The integrated circuit is potted in silicon compound and the board and integrated circuit covered by a lid. The lid projects a short distance onto the second side of the board to prevent over compression of the spring contacts when they are forced onto an external circuit board. In use, the package is positioned so that the spring contacts engage a corresponding set of pad areas on an external printed circuit board, and is then clamped in place, the elasticity of the spring contacts providing the pressure necessary to ensure electrical contact with the pads on the circuit board.

The package is preferably mounted in a frame attached to a printed circuit board. The frame having a plurality of closely spaced apertures penetrating to the surface of the board such that when a package is inserted through one of them it is located with its spring contacts engaging a corresponding set of pads on the printed circuit board, each of the apertures being of such a depth that when a package is inserted therethrough to sit with its spring contacts uncompressed against the pads, its lid projects a short distance out of the aperture, the frame being provided with grooves for the sliding insertion therein of a cover, over the apertures to compress the lid of the package flush with the end of the apertures.

The package is preferably manufactured by the fabrication of a transport tape from a polyester tape, punched at regular intervals with square holes and glued to a first copper tape which is photoetched to leave carrier support tabs projecting into the holes, the soldering of the carrier to the support tabs, the photoetching, bending and tempering of a second copper tape to provide thereon spring contact patterns at the same spacing as the conductors, the bringing together of the transport tape with the second copper take, the soldering of the contact sets to the carrier and the cutting of the contact sets from the second copper tape, the attachment to the carrier of the integrated circuit, the bonding of the integrated circuit to the carrier, the potting of the integrated circuit on the carrier, the attachment of a lid thereover and the cutting of the support tabs.

The present invention is further described, by way of an example in the following description, together with the accompanying drawings in which:

BRIEF DESCRIPTION OF THE DRAWINGS

FIG. 5 shows the transport tape intermediately in its fabrication;

FIG. 6 shows the transport tape at the end of its fabrication;

FIG. 7 shows the spring contact side of the carrier;

FIG. 8 shows the integrated circuit side of the carrier;

FIG. 10 shows the carrier attachment process;

FIG. 13 shows the process for attaching the spring contact set to the carrier;

FIG. 14 shows the process for attaching the integrated circuit, and the lid to the package, completing the manufacturing process.

DETAILED DESCRIPTION OF THE PREFERRED EMBODIMENT

Figure 1:
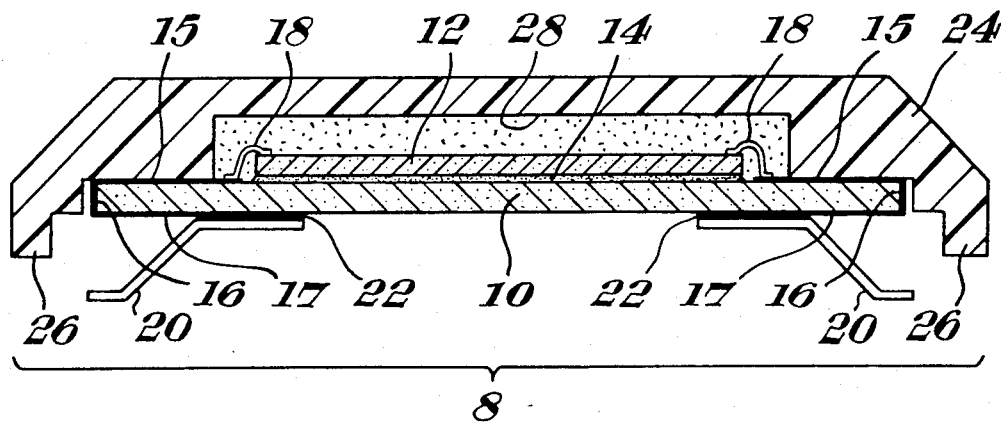
FIG. 1 shows a cross sectional view of the package.

FIG. 1 shows a cross sectional view of the integrated circuit package.

A package 8 for an integrated circuit comprises a planar, glass epoxy or other material carrier 10 having affixed, on one side thereof, an integrated circuit 12 by means of a layer of adhesive 14. The carrier 10 is provided, on its integrated circuit side, with a plurality of electrically separate printed circuit pattern 15 surrounding the integrated circuit 10. Each of the patterns has, associated with it, one out of a plurality of through plated holes 16 which provide a plurality of electrically conductive paths through to the non integrated circuit side of the carrier 10. Ultrasonically welded gold wire bonds 18 electrically connect pad areas on the integrated circuit 12 to the printed circuit patterns in a manner well known in the art. The electrical connections of the bonds 18 are taken to the non integrated side of the carrier 10 via the through plated holes 16. Spring contacts 20 are affixed to the non integrated circuit side of the carrier 10 by means of solder bonds 22 to the conductors 17. The springs 20 are gold plated prevent corrosion and oxidation and provide electrical contact between the integrated circuit 12 and the apparatus of which it is to be a part. The spring contacts 20 are pressible onto pads on a printed circuit board so to provide electrical connection. A lid 24 is hermetically affixed to the integrated circuit side of the carrier 10 to enclose the integrated circuit 12. The lid 24 is provided with projections 26 extending beyond the carrier 10 on the non integrated circuit side for preventing the spring contacts 20 from being pressed too closely onto an external printed circuit board and sustaining damage. The space 28 between the integrated circuit 12 is optionally fillable with potting compound. The lid 24 is preferably fabricated from material having good thermal conductivity for the dissipation of heat generated in the integrated circuit 12. The lid 24 is preferably electrically insulating, but provided it is arranged to touch neither the patterns on the carrier nor any electrically conducting part of an external circuit board, it may be fabricated from any metal.

Figure 2:
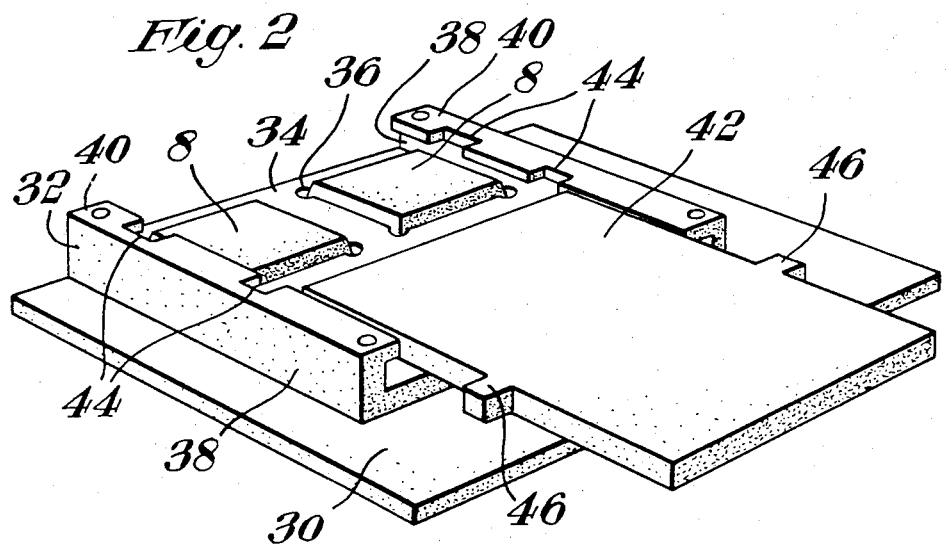
FIG. 2 an oblique view of the package mounting means.

FIG. 2 shows the means for mounting a package onto a printed circuit board.

A printed circuit board 30, has a locator 32 affixed thereon. The locator 32 comprises a central platform 34 in which are set a plurality of holes 36 reaching right to the surface of the printed circuit board 30 for the insertion therethrough of the packaged integrated circuits 8 onto the printed circuit board 30, the spring contacts 20 making electrical connection with a corresponding pattern of pads on the board 30. The lids 24 of the packaged integrated circuits 8 protrude, when the spring contacts 20 are not compressed, a small distance above the level of the central platform 34. Two opposite sides of the central platform 34 are provided with retaining walls 38 a top each of which is provided a lip 40 overhanging the central platform 34. An integrated circuit retaining plate 42, shown in partially withdrawn position, is insertable over the packages 8 and retained by the lips 40 to press the tops of the packages 8 level with the surface of the central platform, so compressing the contacts 20 onto the board 30 and retaining the packages 8 in their holes 36. The lips 40 are provided, on each side of the locator 32, with a plurality of cutaway sections 44. The plate 42 is provided with a corresponding and complementary set of lugs 46. The plate 42 is insertable directly over the packages 8 by passing its lugs 46 through the cutaway sections 44. The plate may then be slid, under the lips 40, a short distance to hold it in place. Wedges are provide beneath the lips 40 to force the lugs 46 hard against the surface of the central platform 34, when so slid. The depth of the holes 36 is chosen such that the packages 8 provide a spring return force, with the plate 42 in place, of the order of 10 grams/spring. The plate 42 may be finned for head dissipation purposes. The locator 32 may be used for as many packages 8 as it is provided with holes 36. Locators 32 may be affixed in pairs, one on either side of the board 30. The pairs need not be identical.

Figure 3:
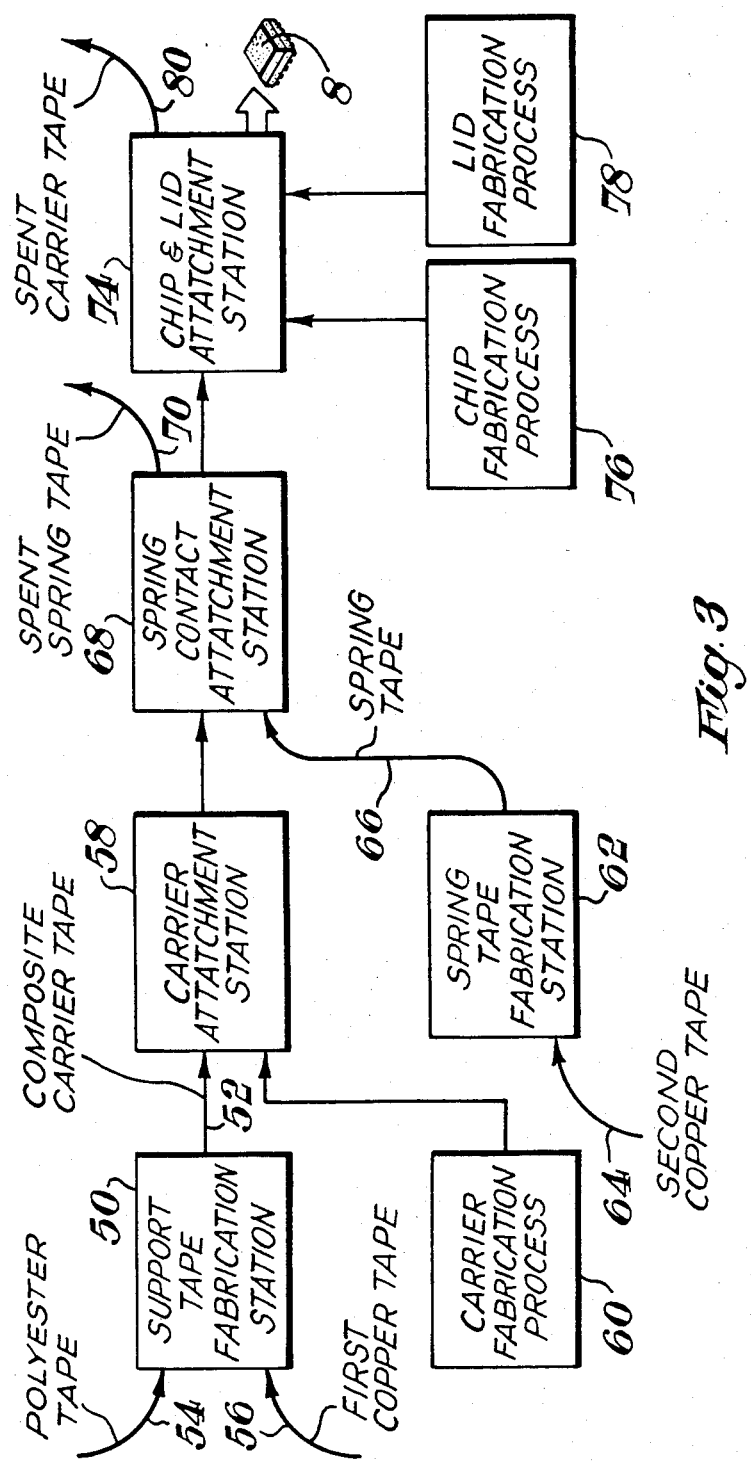
FIG. 3 shows in schematic form, the package fabrication process.

FIG. 3 shows, schematically, the automatic manufacturing process for the integrated circuit package.

An automatic, continuous flow, integrated circuit packaging process comprises a support tape fabrication station 50 for fabrication of a support tape 52 by punching regularly longitudinally space square holes in a polyester tape 54, attaching a first copper tape 56 thereto, and etching the copper tape 56 through the punched holes to leave support tabs for the chip carrier 10.

A carrier attachment station 58 accepts carriers 10 from a carrier fabrication process 60 and solders them by their corners, to the support tabs.

A spring fabrication station 62 accepts a second copper tape 64, etches a pattern for the spring contacts 20 therein, bends the springs 20 to shape, tempers them, gold plates them and presents as its output a spring tape 66 whereon are attached a plurality of spring contact 20 sets at the same regular spacing as the carriers 10 on the support tape 52.

A spring contact attachment station 68 unites the springs 20 with the carriers 10, solders them thereto, cuts the springs 20 from the spring tape 66 and disgards the spent spring tape 70.

A chip and lid attachement station 74 inverts the carrier tape 52, dispenses and attaches one chip 12 onto each carrier 10, bonds the chip 12 to the printed circuit pattern on the carrier 10 with the gold bonds 18, pots the bonded chip 12 in silicon compound, attaches a lid 24 to the pattern and cuts the now packaged chip 8 from the carrier tape 52 by severing the tabs. This station 74 accepts chips 12 from a chip fabrication process 76, accepts lids 24 from a lid fabrication process 78, and disgards the spent carrier tape 80 after the packages 8 have been cut therefrom.

Figure 4:
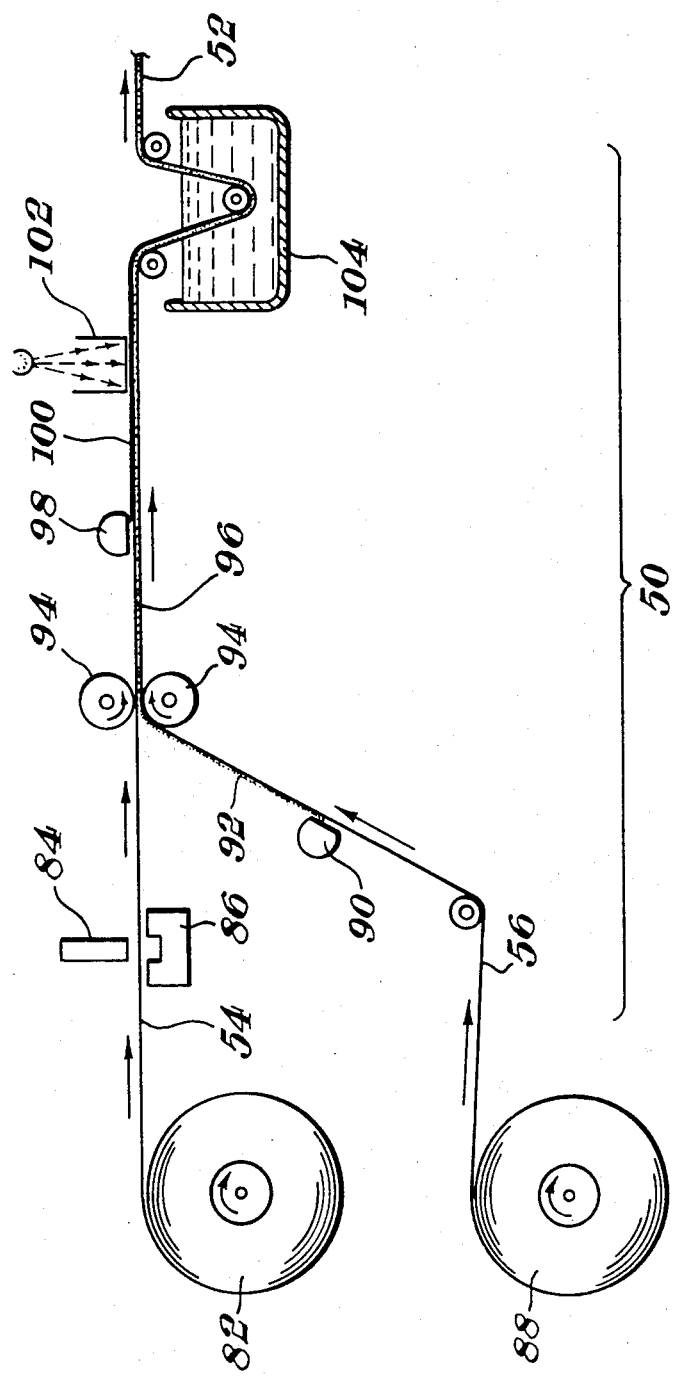
FIG. 4 shows the transport tape fabrication process.

FIG. 4 shows the carrier tape manufacturing process.

A polyester tape roll dispenser 82 dispenses polyester tape 54 under a punch 84 and die 86 which co-operate to punch square holes at regular intervals in the tape 54.

A first copper tape roll dispenser 88 dispenses the first copper tape 56 past an adhesive dispenser 90 for depositing a thin film of adhesive 92 onto one surface thereof.

A pair of pinch rollers 94 compress the punched polyester tape 54 onto the adhesive coated surface of the first copper tape 56 to form a composite tape 96.

A photoresist dispenser 98 deposits a thin film of photoresist 100 onto the polyester side of the composite tape 96. The photoresist is such that those areas exposed to light are subject to etching, and those areas not exposed to light resist etching.

A first lightsource and mask assembly 102 operates with the passage of each of the square holes in the polyester side of the composite tape 96 thereunder to expose the copper visible therethrough with a pattern leaving the support tabs for subsequent attachment of the carrier 10.

The exposed composite tape 96 is passed into a first etching bath 104 which removes the exposed copper. The tape leaving the bath 104, after cleaning to remove excess photoresist, is the composite carrier tape 52.

FIG. 5 shows the composite tape 96. Sprocket holes 106 are provided in each edge for the control of movement thereof. These holes 106 are present in the polyester tape 54 and the first copper tape 56. The composite tape 96 is seen from the polyester side. Copper areas 109 are visible through the square holes 108 in the polyester.

FIG. 6 shows the composite carrier tape 52 resultant from the exposing, etching and cleaning of the composite tape 96. The view is also from the polyester side. Carrier attachment tabs 110, being non-etched copper, are provided at each corner of the through penetrating apertures 112.

FIG. 7 shows the spring contact side of the carrier 10. A plurality of through plated holes 16 penetrates and provides a plurality of conductive paths through to the other side of the carrier 10.

FIG. 8 shows the integrated circuit side of the carrier. A plurality of printed circuit areas 114 are provided for gold wire bonding between the chip 12 and the carrier 10. Each of the areas 114 communicates with the other side of the carrier via one of the through plated holes 16. A clear, central area 118 is provided for affixing the chip 12. Corner printed circuit areas 116 are provided for soldering onto the tabs 110.

Figure 9:
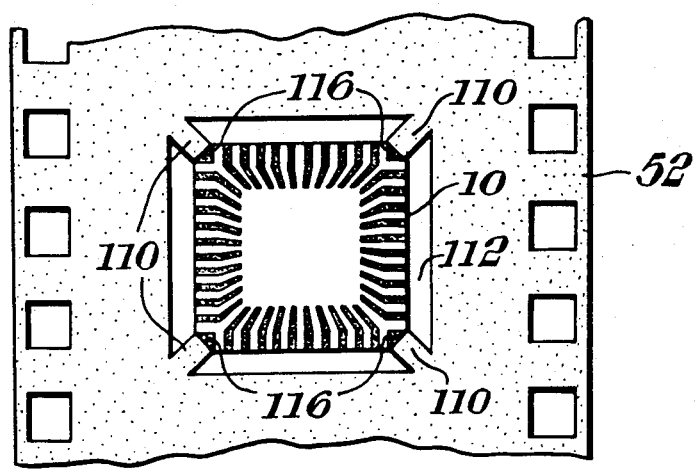
FIG. 9 shows the carrier attached to the transport tape.

FIG. 9 shows, from the copper side, the composite carrier tape 52 after the carrier 10 has been affixed thereto. The corner areas 116 are soldered to the tabs 110, suspending the carrier 10, accessibly from both sides, in the void 112 through the tape 32.

FIG. 10 shows, in schematic form, the carrier attachment station 58 for soldering the carrier 10 to the tabs 110.

The carrier tape 52 passes below a carrier dispenser 120 which places one carrier 10, integrated circuit side downmost, from the polyester side of the tape 52, onto each set of tabs 110 as indicated in FIG. 9. The tape 52 thereafter passes over a soldering station 122, here indicated by a soldering head 122 but replaceable by any form of soldering machine suitable for such use, where the carrier 10 is soldered to the tabs 110 as indicated in FIG. 9.

Figure 11:
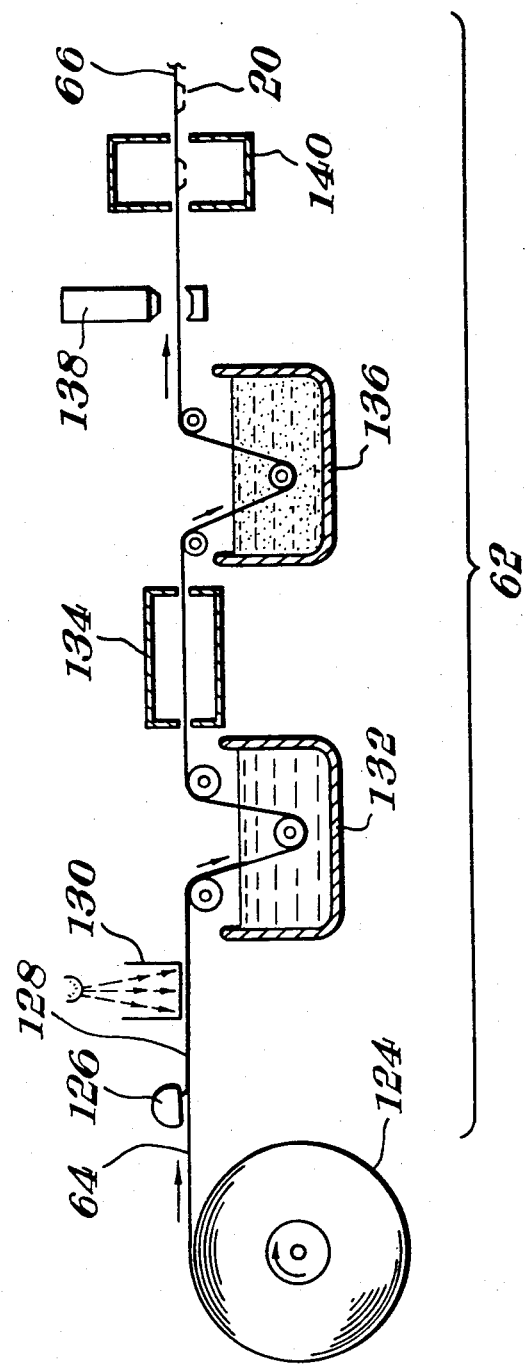
FIG. 11 shows the spring tape manufacture process.

FIG. 11 shows the spring tape fabrication station 62 for making the spring tape 66.

A second copper tape roll dispenser 124 dispenses the second copper tape 64 to a second photoresist dispenser 126 which deposits a thin layer of photoresist 128 thereover. The photoresist 128 is such that areas which are subsequently exposed to light are subject to etching and areas which have not been exposed to light are resistant to etching.

The tape 64 thereafter passes beneath a second lightsource and mask assembly 130 which operates to expose the photoresist 128 at regular intervals along the tapes 64 travel with a pattern which, when etched, provides the spring contacts 20.

The tape 64 passes thereafter into a second etching bath 132 which removes copper from those areas which have been exposed to light.

Having been etched, the tape 64 passes through a cleaning and drying station 134 to remove residual photoresist 128 and prepare the copper for gold plating.

Having been cleaned and dried, the tape 64 is passed through a gold plating bath 136 which deposits a thin layer of corrosion resisting gold thereon.

Having been plated, the tape 64 passes through a bending station 138 which operates, as each etched spring pattern passes therebeneath, to bend them into the profile, indicated in FIG. 1, required for their attachment to the carrier 10.

Bending station 138 comprises two bending tools, the first used to bend the springs 20 for a first pair of opposite sides of the package 8, and the second used to bend the springs 20 for the other pair of opposite sides of the packages, the two sets of springs 20 being complementary to one another and alternating along the length of the tape 64.

Having been bent, the tape passes through a spring tempering stage 140 wherein the spring contacts 20 are rendered elastic by heating and quenching processes.

The tape, exiting from the tempering station 140, is the spring tape 66 whereon are attached a plurality of spring contacts sets 20 with the same longitudinal spacing as the carriers 10 on the carrier tape 52.

Figure 12:
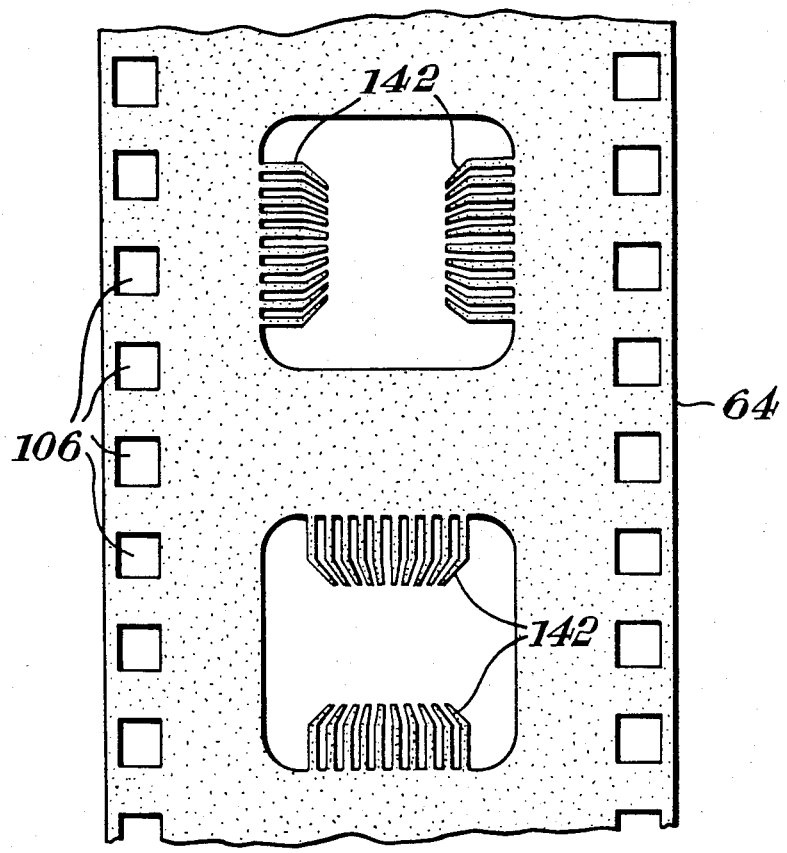
FIG. 12 shows the spring pattern which is etched into the spring tape.

FIG. 12 shows the result of etching the second copper tape 64.

The second copper tape 64 is identical to the first copper tape 56, having the same sprocket holes 106. The etched pattern leaves a plurality of copper fingers 142, one for each of the through conductors 17 on the carrier 10.

FIG. 13 shows the spring contact attachment station 68 for soldering the spring contacts 20 onto the carrier 10.

The spring tape 66 is brought together with the carrier tape 52 such that the tips of the spring contacts 20 just touch their respective through plated holes 16 on the carriers 10.

Thus united, they pass beneath a soldering station 144 which solders the carrier end of the springs 20 to their respective conductors 17 by means of a thermode designed to solder both of the two sets of springs 20 on the spring tape 66 simultaneously to adjacent corners 10 on the carrier tape 52. To solder each spring set 20 a soldering head pushes the carrier end of the springs 20 onto the carrier 10, provides soldering heat, ceases to provide heat while maintaining the pressure on the springs 20 against the carrier 10 so that the solder may set, then withdraws therefrom.

Having been soldered, the springs 20 are cut from the spring tape 66 by a second punch and die set 146 which operates as each carrier 10 passes therebeneath.

The spent spring tape 70 is disgarded and the carrier tape 52 passes out of the station 68 ready for chip mounting.

FIG. 14 shows the chip and lid attachment station 74.

The carrier tape 52, whereon the carriers 10 are affixed with the spring contacts 20 above and themselves below, is passed over an inverting drum 148 so that the carriers 10 are above and the spring contacts 20 below. Any alternative physical inverting means is equally acceptable, for example, means for imparting a 180° twist to the tape 52.

The tape 52 thereafter passes beneath a chip dispenser 150 which places one chip 12 by means of adhesive 14, onto the clear central area of each carrier 10 as each carrier 10 passes thereunder.

The integrated circuit 12 having been affixed to the carrier 10, the tape moves the carrier 10 beneath an automatic gold wire bonding station, well known in the art, which connects pad areas on the chip 12 by means of ultrasonically welded gold wire bonds 18 to the printed circuit areas 114 on the carrier 10.

Having been bonded, the carrier 10 is moved beneath a silicon potting station 154 which pots the integrated circuit 12 onto the carrier 10 with silicon potting compound.

Having been potted, the carrier 10 is moved beneath a lid dispenser 156 which dispenses and affixes the lid 24 over the whole assembly.

The carrier 10 is moved thereafter into a cutter 158 which severs the tabs 110 which hold the carrier 10 to the tape 152. The freed package 8 is simultaneously caught by a receiving device 160.

The receiving device 160 may be a simple bin, a stacker employable as a dispenser in some other automatic chip insertion device, or means whereby the completed package 8 is placed directly onto a printed circuit board.

The spent carrier tape 80 is disgarded

What I claim is:

1. An integrated circuit packaging system, including an integrated circuit package which comprises;
   a planar carrier comprising first and second surfaces, said first surface being adapted for having an integrated circuit affixed thereto,
   a lid for enclosing said integrated circuit against said first surface,
   a plurality of electrical connections for connecting said integrated circuit to said first surface,
   a plurality of electrical conductors for continuing said electrical connections from said first to said second surface, and,
   a plurality of elastic contact springs, affixed to project below said second surface, electrically connected to said plurality of conductors, and compressible to press against external contacts to provide electrical connection between an external circuit and said integrated circuit.

2. An integrated circuit package according to claim 1 wherein said lid comprises one or more projections for extending beyond said second surface to engage said external circuit to limit the amount of compression experienceable by said spring contacts.

3. An integrated circuit package according to claim 2 wherein said plurality of conductors comprises a plurality of through-plated-holes penetrating said carrier from said first to said second surfaces.

4. An integrated circuit package according to claim 3 wherein said spring contacts are soldered to the second-surface ends of said through plated holes.

5. An integrated circuit package according to claim 2 wherein said plurality of conductors comprises a plurality of printed circuit tracks extending across said first surface, traversing the edge of said carrier, and extending across said second surface to couple to said spring contacts.

6. An integrated circuit package according to claim 5 further including a plurality of wire bonds coupling said contact springs to said integrated circuit.

7. An integrated circuit package according to claim 6 wherein said lid comprises a recess for holding said carrier, wherein said carrier is affixable by adhesive, and wherein said projections are the extension of said lid beyond said recess.

8. An integrated circuit package according to claim 7 wherein said carrier is rectangular.

9. An integrated circuit package according to claim 8 wherein said contact springs are disposed around the periphery of said carrier.

10. An integrated circuit package according to claim 9 wherein the space between said integrated circuit and said lid is filled with potting compound.

11. An integrated circuit packaging system as in claim 1, said system including an apparatus for mounting said package against a planar circuit board, said apparatus comprising a package holding frame, said frame being attachable to said circuit board and comprising one or more apertures through penetrating to the surface of said board for the insertion therethrough of said package and the location of said spring contacts against said pads, and,
   a cover, detachably affixable to said frame, for compressing said package into said aperture and retaining said package therein.

12. An integrated circuit packaging system according to claim 11 wherein said frame comprises a platform parallel to and in intimate contact with said board wherein are situated said apertures, and a plurality of side walls extensive above said platform for the holding of said cover in intimate contact with said platform.

13. An integrated circuit packaging system according to claim 12 wherein said side walls comprise a slot parallel to the top of said platform and cutaway portions connective with said slot, and wherein said lid comprises one or more lugs insertable into said slot via said cutaway portions and retainable in said slot thereafter by sliding therealong.

14. An integrated circuit packaging system according to claim 13 wherein said plurality of side walls consists in two parallel walls.

15. An integrated circuit packaging system according to claim 14 for use with a package comprising projections for engaging said board for preventing the overcompression of said contact springs thereagainst, characterised by the depth of said apertures being greater than the combined height of said package and said projections.

16. An integrated circuit packaging system according to claim 15 characterised by said package and said aperture or apertures being of such an outline that said package can fit into said aperture or said apertures only in one, predetermined orientation.

17. An integrated circuit packaging system according to claim 16 wherein said uniqueness of orientation is determined by the presence of a key and counter key on said package and in said aperture respectively, or vice-versa.

* * * * *